United States Patent [19]
Georges et al.

[11] Patent Number: 5,983,070
[45] Date of Patent: *Nov. 9, 1999

[54] METHOD AND SYSTEM PROVIDING INCREASED ANTENNA FUNCTIONALITY IN A RF DISTRIBUTION SYSTEM

[75] Inventors: John B. Georges, Berkeley; David M. Cutrer, Walnut Creek; Kam Y. Lau, Danville, all of Calif.

[73] Assignee: LGC Wireless, Inc., Berkeley, Calif.

[*] Notice: This patent is subject to a terminal disclaimer.

[21] Appl. No.: 08/841,941

[22] Filed: Apr. 8, 1997

Related U.S. Application Data

[63] Continuation-in-part of application No. 08/635,368, Apr. 19, 1996, abandoned.

[51] Int. Cl.$^6$ .............................. H04B 1/26; H04B 3/58
[52] U.S. Cl. .............................. 455/3.1; 455/14; 455/22; 455/71; 455/209; 455/316; 455/318
[58] Field of Search .............................. 455/3.1, 6.3, 14, 455/20, 22, 63, 66, 208, 209, 316, 317, 318, 319, 11.1, 12.1, 6.1, 69, 71

[56] References Cited

U.S. PATENT DOCUMENTS

| | | | |
|---|---|---|---|
| 4,959,862 | 9/1990 | Davidov et al. | 455/6.1 |
| 5,046,135 | 9/1991 | Hatcher | 455/316 |
| 5,109,532 | 4/1992 | Petrovic et al. | 455/63 |
| 5,230,086 | 7/1993 | Saul | 455/71 X |
| 5,404,570 | 4/1995 | Charas et al. | 455/2 |
| 5,603,080 | 2/1997 | Kallander et al. | 455/14 |

FOREIGN PATENT DOCUMENTS 9413067  6/1994  WIPO .............................. H04B 5/00

*Primary Examiner*—John W. Miller
*Attorney, Agent, or Firm*—Lumen Intellectual Property Services

[57] ABSTRACT

A system and method for transmitting a radio frequency (RF) signal in a RF bandwidth over a low bandwidth medium, e.g., in-building unshielded twisted pair (UTP) cabling, which has a transmission bandwidth below the RF bandwidth. The system has a unit for receiving the RF signal and a global reference oscillator for distributing a global reference tone of high stability to the entire system. Local oscillators controlled by this global reference tone deliver RF reference tones of high stability required for mixing the RF signal to obtain an intermediate frequency (IF) signal which is fed through the low bandwidth medium to remote sites. A 10 base T cable network, often pre-existing in many building structures, provides a suitable, cost effective low bandwidth medium for such RF communication. Two of the four twisted pair cables of a UTP cable are sufficient to support bi-directional communication. The remaining twisted pair cables are used to control remote site antenna functions or support other types of communication services such as data LAN, video, wired voice, or other wireless services such as PCS or wireless LAN.

27 Claims, 11 Drawing Sheets

METHOD AND SYSTEM PROVIDING INCREASED ANTENNA FUNCTIONALITY IN A RF DISTRIBUTION SYSTEM

RELATED APPLICATIONS

This application is a continuation-in-part of copending patent application Ser. No. 08/635,368 filed Apr. 19, 1996 now abandoned, which is hereby incorporated by reference.

BACKGROUND

1. Field of the Invention

The present invention relates to the field of radio-frequency (RF) signal distribution, and in particular to an apparatus and method for distributing RF signals through low bandwidth infrastructures for re-transmission by antennas, wherein additional signals for controlling the antennas are transmitted over same low bandwidth infrastructures.

2. Description of Prior Art

The need for efficient and low-cost systems for distributing radio frequency (RF) signals has continued to increase as the demand for wireless communications has rapidly grown. Distribution of RF signals is particularly difficult and expensive in areas with many natural and man-made obstacles which scatter or absorb RF radiation. For example, the problem of RF distribution is especially acute inside and around building structures.

Current in-building distribution systems consist of two major parts. The first is a set of antennas and associated accessories required for re-transmitting the RF signals inside a building. The second is a cabling system, e.g., an optical fiber network, used for interconnecting the in-building antennas with a main antenna. The latter is usually installed on top of the building or at some location where the external RF signals can be easily received. In cases where the RF signals are supplied via a high transmission bandwidth cable the main antenna can be replaced by a direct interface with the RF network, e.g., in the basement.

The cost of installing and maintaining such in-building distribution networks is very high. One of the major cost factors is the cabling network. Not only must cable for carrying RF signals be installed but another set of cables and wiring is needed to incorporate any monitoring and diagnostic features into the system, e.g., the ability to control the gain of the re-transmitting antennas or check if the antennas are operational from a centralized building location. In addition, running new cables between various rooms, floors, or wings of a building is usually time-consuming and disruptive. For these reasons, desirable solutions to in-building RF distribution systems should incur minimal installation cost, require no special tooling (as necessitated, e.g., in fiber optic networks), and produce no undue disturbance in the building during installation and operation. It would also be advantageous for such distribution networks, including monitoring and diagnostic subsystems, to be consistent or implementable with common in-building cable infrastructure.

The most effective manner of satisfying these criteria would be to use an existing or standard in-building cable infrastructure. To find in a typical building a pre-existing cable which can transmit RF signals bi-directionally, let alone accomplish this and simultaneously be used to monitor antenna functionality, may seem especially surprising to most. The only conceivable candidates for pre-existing media for consideration would be standard in-building cabling such as unshielded or shield twisted pair (UTP and STP) used for local area networks (LAN), telephone cables, multi-mode optical fiber links, and power lines.

Unfortunately, several obstacles must be overcome to make use of standard in-building cabling. The major problem is related to the frequency bands used for transmitting RF information signals. Cellular communications presently utilize a carrier frequency around 1 GHz. For, example, the AMPS protocol uses the bandwidth from 824–894 MHz and GSM is transmitted between 890–960 MHz. Recent legislation has allowed PCS services to move to even higher frequencies (e.g., 1,850–1,990 MHz). In comparison, the standard in-building unshielded or shielded twisted pair cables are limited to much lower transmission bandwidths.

The most common standard cable category 5 (10 base T) UTP cable, for example, has signal loss and cross talk properties that limit the bandwidth to approximately 0–100 MHz for distances <100 m. Although these parameters suffice for LAN applications, they are clearly inadequate for the delivery of cellular and PCS signals to and from remote antenna sites. This is especially unfortunate in that 10 base T cable contains four twisted pair cables each of which, as suggested by the parent application cited above, could otherwise be used to transmit signals for radio communication or for antenna monitoring and control.

Prior art solutions, therefore, employ wide bandwidth media such as coaxial cables and optical fibers. These media have to be installed separately, and require specially trained personnel, as discussed above.

Thus, the challenge is to transmit high frequency RF signals over the standard low bandwidth infrastructures, especially 10 base T cable. The common method of accomplishing this goal is to initially down-convert the band of the RF signal to an intermediate frequency (IF) which is within the bandwidth of the cable. Then, the IF signal is fed through the standard low bandwidth cable found in the building. At the remote antenna site the IF signal is up-converted to recover the original RF signal and the recovered RF signal is re-transmitted by the remote antenna. This solution is illustrated in FIG. 1 and will be discussed in the detailed description.

A major problem encountered in implementing this solution involves the stability of local oscillators. These provide the reference signals required by the mixers to down-convert and up-convert the signals. To ensure proper operation the local oscillators must generate a stable tone at the selected high RF frequency (e.g., 800 MHz). It is critical that the frequency of the two oscillators be matched to within at least the channel spacing of the RF signals. In fact, it is desirable that the oscillators be "locked" to each other to preserve the frequency of the RF signal band. This issue becomes even more crucial at higher frequencies, e.g., the PCS bandwidth centered around 2 GHz where the relative width of the communication channels is small in comparison to the carrier frequency.

The two solutions to this problem are to either use very stable oscillators (e.g., <1 part per million stability), which are prohibitively expensive, or to distribute the oscillator tone from a central location. The second option is not viable either, since the media under consideration does not have the bandwidth required for the implementation of such a system.

The existing solutions to distributing a stable oscillator tone are limited. In U.S. Pat. No. 5,046,135 Hatcher shows how to eliminate frequency instabilities in a receiver frequency converter due to inherent local oscillator instability by adding a marker signal at the down-conversion stage. The marker signal is distorted in the same manner as the IF signal and a second stage down-converter computes this distortion by comparison with the marker signal before undertaking any further down-conversion.

This solution is complicated, since it breaks down the conversion process into two steps and requires the addition of a marker tone in addition to the oscillator frequencies and the signal. Moreover, it cannot be employed in conjunction with the low bandwidth media found in buildings. Indeed, the main purpose of the invention is to gradually and reliably down-convert very high-frequency signal received, e.g., from satellites in orbit.

U.S. Pat. No. 4,959,862 issued to Davidov et al. addresses a novel scheme for the delivery of FM modulated subcarriers over a fiber-optic link for cable television transmission (CATV). Conventional CATV systems use vestigal sideband amplitude modulation (VSB-AM) for transmission of analog video channels to home users. In comparison, frequency division multiplexed frequency modulated (FDM-FM) signals can provide a higher signal to noise ratio and a longer transmission distance. Davidov et al. describe a method for the conversion of VSB-AM channels to FDM-FM channels before transmission over the fiber-optic link. After transmission, the FM signals are re-converted back to AM signals before transmission to the home. A 4 MHz "global reference" is distributed along with the FM signals to AM signals.

Although Davidov et al. address the idea of a global signal which can be used for reference ("locking") of conversion stages, this idea is inapplicable to the problem at hand. First, the reference signal is high frequency and is distributed to the remote antenna sites for the purpose of FM to AM signal conversion. It is not a signal which is compatible with a system based on a limited and low bandwidth medium for transmitting RF signals. In fact, Davidov et al. emphasize the fact that this system uses a fiber-optic medium which is broadband. Moreover, in Davidov's system architecture it is not necessary to use the global reference, rather it is provided for convenience. The only advantage Davidov et al. derive from using a centralized oscillator is the reduction of oscillator phase noise.

In U.S. Pat. No. 5,109,532 Petrovic et al. discuss the transmitter and receiver of a radio communication link. This link requires up- and down-conversion of the signals to be transmitted to and from the radio band of interest. The frequency and phase of the oscillators used for up- and down-conversion are a large cost and performance consideration.

The problem is solved by adding a radio frequency pilot tone to the up-converted signals before transmission. At the receiver, a local oscillator is used to down-convert both the RF signal and the pilot tone. Any phase or frequency deviations of the local oscillator affect the RF signal and the pilot tone equally. Therefore, both signals can be used to cancel the phase and frequency variations, resulting in a clean recovered signal. This cancellation method solves the problem of local oscillator stability at the receiver.

Although the disclosure is intended to solve a similar problem as the present invention, namely the stability of a remote oscillator, the method by which the problem is solved is quite different. Furthermore, the method does not describe, nor is it obvious, how one would implement this technique over a low-bandwidth medium, since the pilot tone is at a RF frequency.

In addition to devising a system for proper "locking" of oscillators to be able to transmit RF signals through low bandwidth infrastructure there are additional unsolved problems. In a typical RF distribution system multiple remote antennas re-transmit the up-converted RF signal. To ensure complete coverage the coverage areas of the individual antennas overlap. Thus, a user will frequently receive signals from multiple antennas simultaneously. When the individual oscillators used for the up-conversion at those antennas are not exactly frequency matched the user will hear a baseband tone or beat at the difference between the frequencies of the two local oscillators.

Thus, efficient and reliable distribution of RF signals over low bandwidth infrastructures remains an unsolved problem.

OBJECTS AND ADVANTAGES OF THE INVENTION

In view of the shortcomings of prior art, it is an object of the invention to provide a system and method for distributing RF signals through low bandwidth infrastructure. In particular, it is an object of the invention to enable one to distribute RF signals through standard in-building cabling.

Another object of the invention is to provide control and monitoring of re-transmitting antennas through the same standard in-building cabling transmitting RF signals.

Another object of the invention is to ensure that the system is highly efficient in its use of resources, simple to install and operate, and low-cost.

Yet another object of the invention to provide a method and a system for distributing RF signals in buildings which avoid oscillator instabilities which generate beat frequencies and related effects and lead to decreased link quality.

These and other objects and advantages will become more apparent after consideration of the ensuing description and the accompanying drawings.

SUMMARY OF THE INVENTION

The objects of the invention are achieved by a unique system for transmitting a radio frequency (RF) signal in a RF bandwidth over a low bandwidth medium which has a transmission bandwidth below the RF bandwidth. Typically, the low bandwidth medium is a standard unshielded twisted pair (UTP) cable belonging to common in-building infrastructure. The UTP cable commonly consists of four twisted pair cables, two of which are used for bi-directional transmission of RF signals according to the invention, while the remaining two cables are used for antenna controlling and monitoring. In this manner the invention takes advantage of pre-existing infrastructure in a highly efficient and cost effective manner.

The RF bandwidth is usually selected from the group of RF bandwidths used for cellular communications, cordless telephony, local RF communications, satellite television, interactive multi-media video, high bit-rate local area networks and the like. In these situations the RF bandwidth is narrower than the transmission bandwidth of the low bandwidth medium, typically UTP cable as noted above.

The system has a unit, usually a main antenna or base station, for receiving the RF signal. A global reference oscillator, preferably a very high stability oscillator such as a temperature-stabilized crystal oscillator, provides a global reference tone of high stability, e.g., <1 part per million stability, at a frequency within the transmission bandwidth of the low bandwidth medium. In the preferred embodiment the global reference oscillator is located in a safe location inside a distribution hub and the global reference tone is delivered from there to the entire system, preferably over one of the four twisted pair cables in a UTP cable.

A first local oscillator, preferably a voltage-controlled oscillator (VCO), is controlled by a first adjustment signal derived from the global reference tone. With the aid of the first adjustment signal the first local oscillator generates a first RF reference tone of high stability. The main antenna and the first local oscillator are connected to a first mixer, such that the first RF reference tone and the RF signal are delivered to this first mixer. From these two signals the mixer generates an intermediate frequency (IF) signal, which is fed through the low bandwidth medium, preferably one of the four twisted pair cables. The IF signal has a frequency contained within the transmission bandwidth of the low bandwidth medium.

A second local oscillator is provided at a remote location, e.g., in a remote coverage area. The second local oscillator is controlled by a second adjustment signal also derived from the global reference tone. In this manner the second local oscillator generates a second RF reference tone of high stability at the same frequency as the first RF reference tone. A second mixer is also provided at the remote location and connected to the second local oscillator and to the low bandwidth medium. Thus, the second mixer receives the second RF reference tone and the IF signal. By mixing these two signals the mixer recovers the original RF signal. Of course, this system can be extended to any number of remote locations, as will be necessary in a practical system which provides radio coverage to an entire building structure such as an office building or a shopping center.

The method for deriving the first and second adjustment signals relies on a phase-locking circuit or a phase-locked loop (PLL). The global reference tone can be delivered to the PLL in several ways. In particular, it can be delivered directly through a separate link, e.g., a short communication link if the global reference oscillator is positioned close to the oscillator in question. This is the case when both the local oscillator and the global reference oscillator are located in the same housing, such as a main hub. Otherwise, the global reference tone can be transmitted together with the IF signal through the low bandwidth medium, e.g., over the same twisted pair of a UTP cable.

A filter is used for retrieving the global reference tone from the low bandwidth medium at the remote location. This function can be performed by a simple band-pass filter with its window set for the global reference tone. The PLL in this event is located between the filter and the local oscillator at the remote location.

The recovered RF signal can be re-transmitted at one or many Iremote locations at a communication station. Usually, the communication stations comprise local antennas with overlapping coverage areas.

In a preferred manner of practicing the invention, the system is configured for bi-directional communication. A remote site antenna or communication station is connected to the main antenna or base station through a network of low bandwidth UTP cable contained within a building structure. One twisted pair cable in the UTP cable carries IF signals from the main antenna to the communication station, which up-converts the signals to RF signals and transmits the RF signals into the coverage area. Likewise, the communication station receives RF signals from the coverage site, such as from a cellular telephone, and down-converts the RF signals to IF signals for transmission over a second twisted pair of the UTP cable to the main antenna.

The detailed description below further teaches how the remaining two twisted pair cables are used to control and monitor the remote site antenna from a centralized location within the building structure. For example the voltage on a third twisted pair cable can be used to control the gain of remote site antennas. The fourth twisted pair cable can be used to monitor the antenna, from a centralized location, determining whether or not the remote site antenna is drawing power. Alternatively, the fourth twisted pair cable can be used to deliver another communication service to the remote site.

Further details and the preferred embodiment are described in the specification in reference to the attached drawing figures.

DESCRIPTION

The salient features of the invention will be best appreciated after reviewing the typical prior art distribution system 10 for radio frequency (RF) signal 12 illustrated in FIG.

Figure 2:
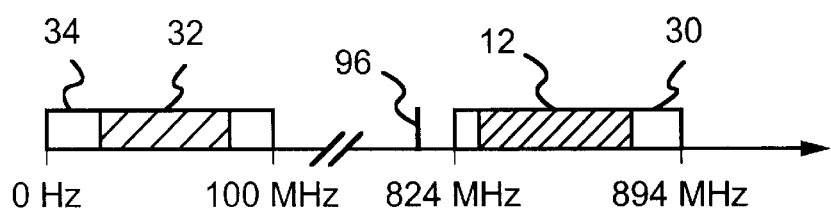
FIG. 2 is a diagram showing the typical RF bandwidth and a typical transmission bandwidth.

1. In this typical system RF signal 12 is in a bandwidth typically used for cellular communications or the like. FIG. 2 indicates a RF bandwidth 30, spanning the range from 824 MHz to 894 MHz. This range is typical for RF signal 12 used in cellular communications.

RF signal 12 is received by base station or main antenna 14. Connection 16, e.g., a coaxial cable, delivers RF signal 12 from antenna 14 to one of the inputs of a first mixer 18. The second input of mixer 18 is connected to a first local oscillator 20. Oscillator 20 provides an RF frequency tone which is utilized by mixer 18 to down-convert RF signal 12 to an intermediate frequency (IF) and to feed it through a low bandwidth medium 33, such as a standard, pre-installed cable.

FIG. 2 better illustrates the relationships of the various signals and their bandwidths. In particular, the down-conversion of RF signal 12 from RF bandwidth 30 yields an IF signal 32 contained in a transmission bandwidth 34. Transmission bandwidth 34 ranges from 0 to 100 MHz, which is typical for low bandwidth media commonly installed in building structures.

Figure 1:
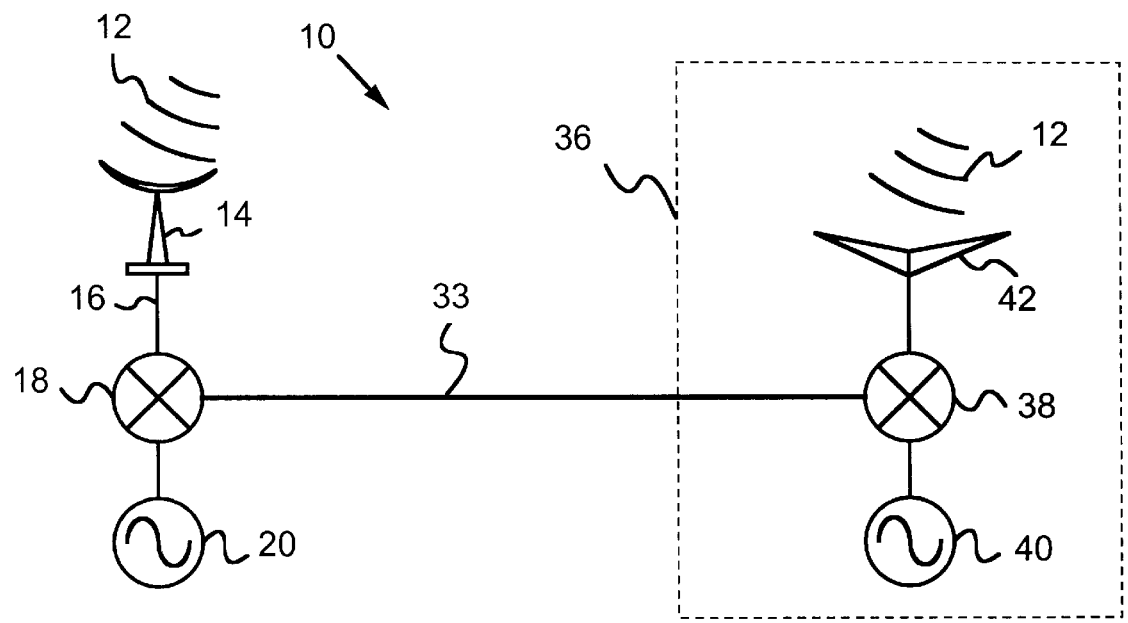
FIG. 1 is a schematic view of a typical prior art RF distribution system.

Referring back to FIG. 1, IF signal 32 is transmitted through medium 33 to a remote location or site 36 delineated by a broken line. Site 36 is usually a room inside a building structure or some other area in which RE coverage is desired. At this location IF signal 32 is received by a second mixer 38, which, with the aid of oscillator 40, up-converts IF signal 32 to recover original RF signal 12. Then, a remote antenna 42 is used to re-transmit RF signal 12 in remote site 36.

As outlined in the background section, distribution system 10 and other related prior art systems suffer from instability of local oscillators 20 and 40 (unless very expensive oscillators are used). An RF distribution system 50 according to the invention and shown in FIG. 4 avoids this disadvantage in a simple and effective manner.

As in the prior art example, system 50 has a main or base antenna 52 which receives RF signal 12. Antenna 52 is connected by a communication link 54, e.g., a coaxial cable or any other link capable of transmitting RF signal 12 without undue distortions, to one of the inputs of a first mixer 56. The type of device selected as mixer 56 can include any suitable single ended, balanced, double-balanced, double-double balanced or other mixer. A first local oscillator 58, preferably a voltage-controlled oscillator (VCO), is connected to another input of mixer 56. A low bandwidth medium 60, such as 10 base T cable, telephone wire, fiber-optic cable, unshielded or shielded cable, power cable, or any other low bandwidth in-building medium is connected to the output of mixer 56.

Oscillator 58 is typically a low-cost device which by itself produces an unstable RF reference tone. One output of oscillator 58 is connected to mixer 56 and another output leads to a frequency divider 62. The function of divider 62 is fulfilled by any frequency dividing device or circuit capable of dividing the received tone by an integer. The output of divider 62 is further connected to one input of a phase comparator 64. Suitable comparators are well-known in the art.

The second input of comparator 64 is connected to a global reference oscillator 66. As shown, oscillator 66 is housed in a separate housing unit or distribution hub 68. In order to ensure stability and high performance of oscillator 66 hub 68 is installed in an area not exposed to excessive temperature fluctuations, vibrations, or other external influences. These conditions are frequently met inside buildings away from windows, doors, or other openings, e.g., in basements. In addition, the preferred embodiment employs as oscillator 66 a temperature-stabilized crystal oscillator. Devices of this kind can achieve stability figures of about 1 part per million and are commercially available. The frequency of oscillator 66 will be discussed below.

It should be noted, that only one oscillator 66 is used in system 50. Thus, any element of system 50 in need of the tone from oscillator 66 can be supplied with it through lines 70. In this case, one of lines 70 connects oscillator 66 to the other input of comparator 64.

The output of comparator 64 is connected to a filter 72. A suitable low-pass loop filter is well-known in the art and can be constructed from commercially available components. The output of filter 72 is connected to the control input of oscillator 58.

In the preferred embodiment system 50 has a summing element or adding device 74 connecting one of lines 70 to low bandwidth medium 60. Device 74 can combine signals already traveling through medium 60 with any additional signal, in this case the signal produced by oscillator 66. Devices capable of performing this operation are well-known in the art.

At a remote coverage location or site 76 medium 60 is connected to a filter 78 and to a second mixer 80. Filter 78 has a pre-set band-pass for selecting a specific frequency from the signals transmitted through medium 60. The output of filter 78 is connected to one of the inputs of a phase comparator 82. The other input of comparator 82 is connected to the output of a frequency divider 84, analogous to frequency divider 62, which, is connected to a second local oscillator 86. As before, local oscillator 86 is a voltage-controlled oscillator which produces an unstable RF reference tone. The output of comparator 82 is hooked up through a filter 88 to the controlling input of oscillator 86.

Together, oscillator 86, divider 84, comparator 82 and filter 88 form a phase-locking device or circuit 90, frequently also called a phase-locked loop (PLL). In fact, oscillator 58, filter 72, comparator 64 and divider 62 also form a phase-locking circuit 92. Both circuits, 90 and 92, are analogous in construction and operation, as will be shown below.

Remote coverage site 76 has a re-transmitting unit 95, or RF antenna for re-transmitting RF signal 12 from mixer 80. Proper positioning of antenna 95 at site 76 to ensure RF coverage will be determined by the persons installing system 50 on a case by case basis.

During operation, main antenna 52 of RF distribution system 50 receives RF signal 12. As indicated in FIG. 2, RF signal 12 is contained in RF bandwidth 30 ranging from 824 MHz to 894 MHz. In practice, however, RF signal 12 can belong to other RF bandwidths, depending on the type of communication. Thus, RF bandwidth 30 can be selected from the group of RE bandwidths used for cellular communications, cordless telephony, local RF communications, satellite television, interactive multimedia video, high bit-rate local area networks, and the like. The characteristic feature shared by all these RF bandwidths is that they are higher than transmission bandwidth 34 of medium 60.

Figure 3:
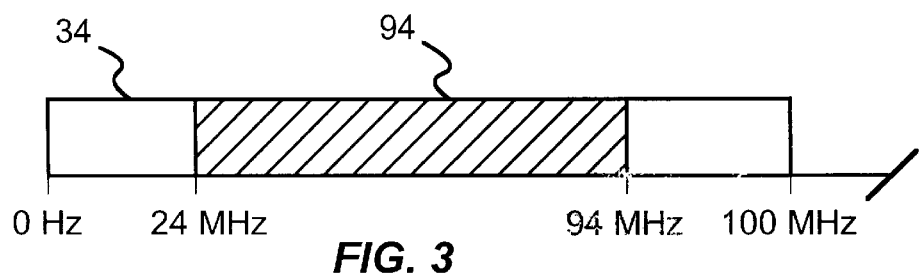
FIG. 3 is a diagram showing the transmission bandwidth and the bandwidth of the IF signal.

Antenna 52 delivers RF signal 12 via communication link 54 to first mixer 56. Meanwhile, phase-locked loop 92 delivers a first RF reference tone 96 (see FIG. 2) of high stability to mixer 56. According to known mixing techniques, first mixer 56 responds to these two inputs by generating an IF signal 94, or, in other words, downconverting RF signal 12. The result of the down-conversion—IF signal 94—is shown in FIG. 3. In the present embodiment, IF signal 94 has a narrower bandwidth (894 MHz–824 MHz=70 MHz) than transmission bandwidth 34 of medium 60. In fact, IF signal 94 only takes up the bandwidth from 24 MHz to 94 MHz. The actual bandwidth of down-converted RF signal 12, i.e., IF signal 94, can vary as conditioned by available in-building infrastructure. At any rate, since the output of first mixer 56 is connected to medium 60, IF signal 94 is transmitted or fed through medium 60.

The down-conversion process itself depends on the stability of first RF reference tone 96 supplied to first mixer 56, and the former usually depends on the stability of first local oscillator 58. In this case, however, the output of oscillator 58 is a first RF reference tone 96 of high stability. This result is achieved in several steps with the aid of the remainder of phase-locking circuit 92 and global reference oscillator 66.

Figure 5A:
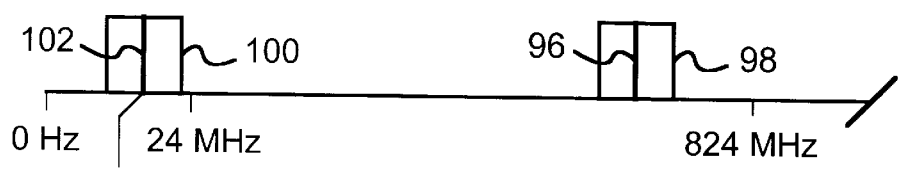
FIG. 5A is a diagram showing the stabilization of reference tones.
Figure 5B:
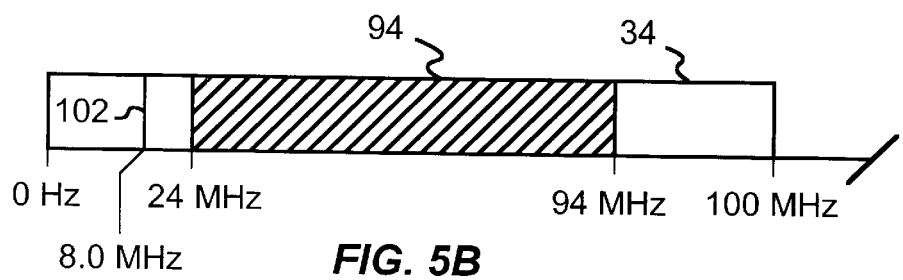
FIG. 5B is a diagram showing the relationship between the IF signal and the global reference tone.

First, as illustrated in FIG. 5A, the original output of oscillator 58 which is an unstable RF reference tone 98 is fed to frequency divider 62. The inherent fluctuation of tone 98 is evident from its wide spread of possible frequencies. Divider 62 is set to divide tone 98 by an integer to derive an unstable IF reference tone 100, as shown. It is intended that unstable IF reference tone 100 match closely the frequency of a global reference tone 102 generated by global reference oscillator 66 residing in distribution hub 68. Also, unstable IF reference tone 100 as well as global reference tone 102 are contained within transmission bandwidth 34 of medium 60.

For most reliable operation, global reference tone 102 is in the middle of the bandwidth occupied by unstable IF reference tone 100. Furthermore, it is preferable that the bandwidth of IF reference tone 100, and consequently the frequency of global reference tone 102, lie outside the bandwidth of IF signal 94. This configuration avoids any potential interference between IF signal 94 and reference tone 100. In FIG. 5A the bandwidth of IF reference tone 100 is below the bandwidth of IF signal 94 and centers around the frequency of global reference tone 102 equal to 8.0 MHz. Of course, these figures have been selected for demonstration purposes only.

Phase comparator 64 receives at its two inputs unstable IF reference tone 100 and, through line 70, the highly stable global reference tone 102. In response to these two inputs comparator 64 generates at its output a first adjustment signal 104 representative of the phase mismatch or difference between unstable tone 100 and stable tone 102. Filter 72 clears adjustment signal 104 of high frequency noise, and ensures stability of the feedback loop. From filter 72 adjustment signal 104 passes to the control input of first local oscillator 58. There, adjustment signal 104 is used to fine-tune the oscillation frequency of oscillator 58.

Thanks to the feedback nature of phase-locking circuit 92, the fine-tuning or trimming of oscillator 58 is performed continuously using the very stable global reference tone 102 as the benchmark. Consequently, the output of oscillator 58 is forced to generate first RF reference tone 96 of high stability. First mixer 56 takes advantage of this high stability reference tone 96 to produce very accurately down-converted IF signal 32, which is then fed through medium 60.

In the preferred embodiment distribution hub 68 is connected to summing element 74, which interfaces with medium 60.

Thus, global reference tone 102 from oscillator 66 is delivered to summing element 74. There, IF signal 94 already traveling through medium 60 is combined with global reference tone 102 and sent through medium 60 to remote coverage site 76. No undesirable interference is created between IF signal 94 and tone 102 result, since their bandwidths do not overlap. In this manner, global reference tone 102 is efficiently forwarded to remote site 76 through the same medium as the useful signal.

At remote site 76 filter 78 retrieves global reference tone 102 from medium 60. Meanwhile, IF signal 94 passes through to second mixer 80. Phase-locking circuit 90, operating in the same manner as phase-locking circuit 92, uses tone 102 to stabilize the output of second local oscillator 86. For this purpose comparator 82 produces a second adjustment signal 106 and delivers it through filter 88 to the control input of oscillator 86. The output of oscillator 86 generates stable RF reference tone 96. Mixer 80 uses stable RF reference tone 96 to up-convert IF signal 94 and recover RF signal 12 with minimal signal distortion. Then, RF antenna 95 receives RF signal 12 and re-transmits it throughout site 76.

System 50 is thus well-adapted to RF distribution in buildings and other structures using existing low bandwidth media such as conventional cables. The system resources are basic. Only one cost-intensive oscillator, namely global reference oscillator 66, is required to ensure proper up- and down-conversion of signals in this arrangement. The other essential elements are simple, easy to install, and generally low-cost. In fact, voltage-controlled oscillators, such as oscillators 58 and 86 generating stable reference RF reference tone 96 at 800 MHz using 3.125 MHz as global reference tone 102 can achieve high stability at a very low cost.

Figure 6:
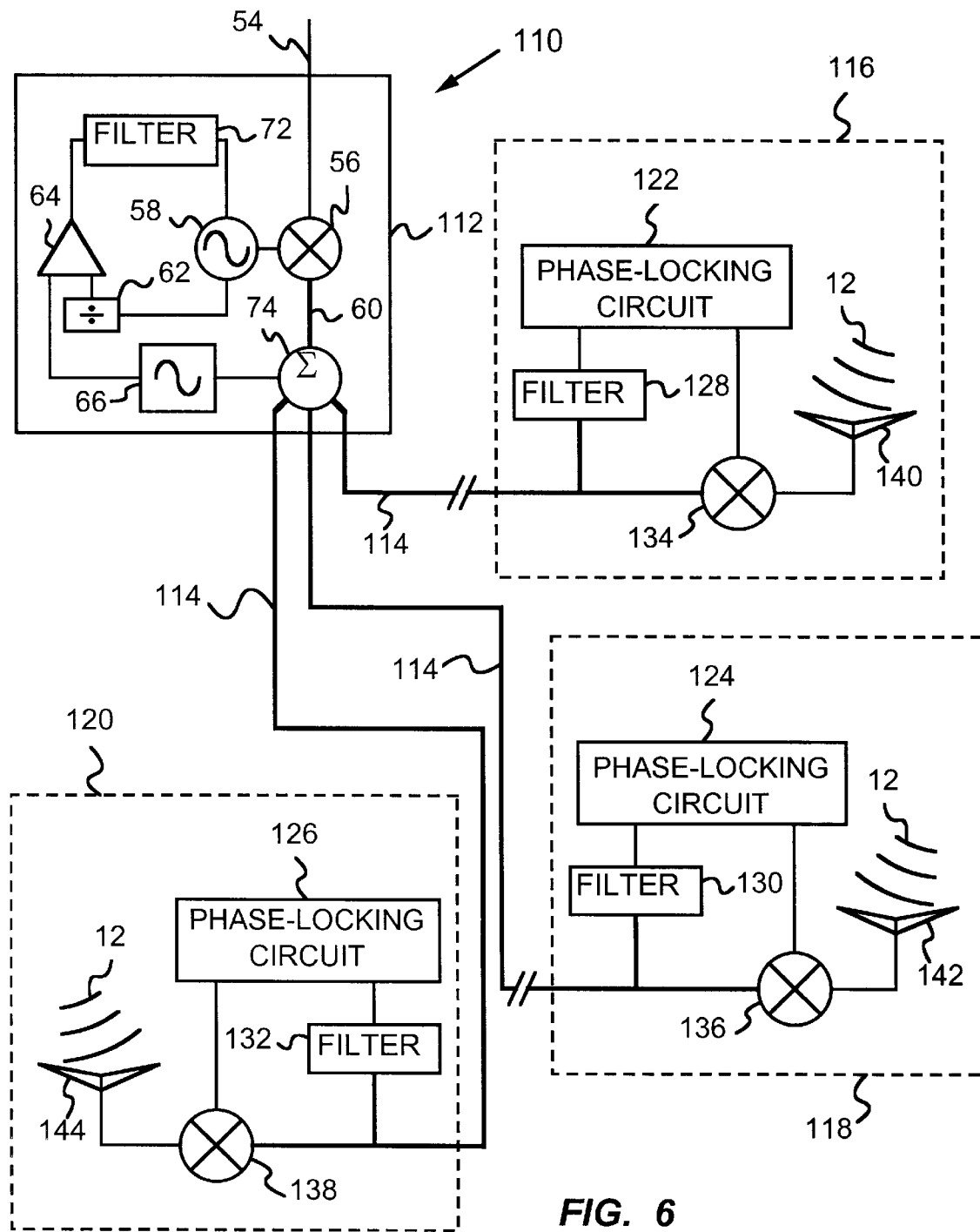
FIG. 6 is a schematic view of an RF distribution system according to the invention with multiple remote coverage sites.

The above embodiment is very simple and serves mainly to demonstrate a few fundamental aspects of the invention. A more practical RF distribution system 110 according to the invention is illustrated in FIG. 6. Corresponding parts of this embodiment are designated with the same reference numbers as in the first embodiment.

Communication link 54 delivers RF signal 12 to a main hub 112. Housed inside main hub 112 is first mixer 56 and first local oscillator 58. Divider 62, comparator 64 and filter 72 are connected and operate in the same manner as described above and are also housed in hub 112. In fact, global reference oscillator 66 and summing element 74 are inside hub 112 as well. In this manner, all elements necessary to convert RF signal 12 to IF signal 94 are arranged in the same compact unit.

Summing element 74 is connected to three low bandwidth cables 114, which are routed to their respective remote coverage sites 116, 118, 120. Phased-locking circuits 122, 124, 126 and filters 128, 130, and 132 are connected in the same manner and perform the same functions as filter 78 and circuit 90 in the previous embodiment. In other words, circuits 122, 124, 126 and filters 128, 130, and 132 allow each remote site 116, 118, 120 to filter out global reference signal 102 and use it to produce a stable second RF reference signal 96. Furthermore, each remote site 116, 118, 120 has its own second mixer 134, 136, and 138 for recovering RF signal 12 from IF signal 94. After recovery RF signal 12 is re-transmitted at each remote site 116, 118, 120 by a corresponding RF antenna 140, 142, 144.

Distribution system 110 is more compact and practical in some applications by virtue of using one single hub 112. Of course, the construction and location of hub 112 have to ensure that the internal elements are protected. Especially global reference oscillator 66 has to be isolated in a manner to ensure stability of global reference tone 102.

Figure 7:
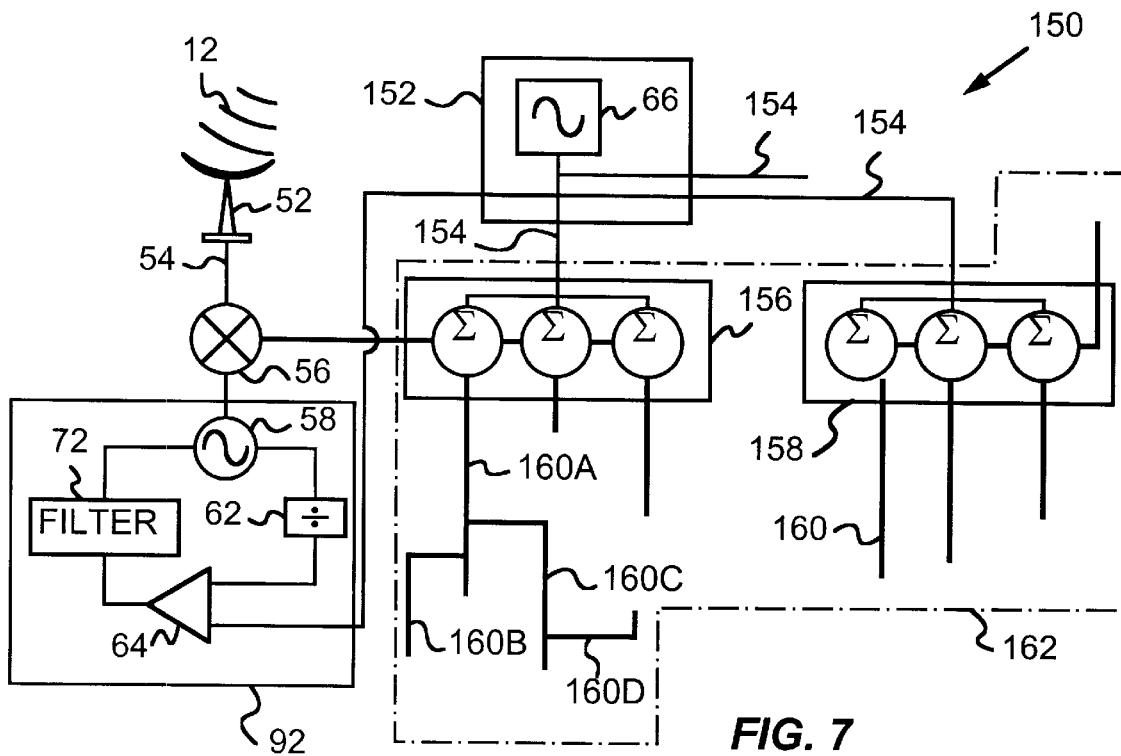
FIG. 7 is a schematic view of another RF distribution system according to the invention.

FIG. 7 illustrates another RF distribution system 150 according to the invention. As in the previous embodiments, RF signal 12, received by main antenna 52, is delivered to first mixer 56 to be down-converted to produce IF signal 94. Global reference oscillator is housed separately in a distribution hub 152. From there global reference tone 102 is distributed through links 154 to network hubs 156 and 158, and to phase-locking loop 92.

Network hubs 156 and 158 contain multiple summing elements 74 which allow one to launch global reference tone 102 on many low bandwidth cables 160. In fact, cables 160 constitute a network 162. Cables 160A–D, when viewed independently, form a tree network, while all cables 160 form two star networks with hubs 156 and 158 representing their centers.

It is clear from this embodiment that distribution system 150 of the invention can be adapted to any existing network of in-building cables. In particular, any star network, tree network, ring network or branch network is suited for distributing RF signal 12 according to the invention. In addition, links 154 do not need to be part of the network infrastructure if other media for distributing global reference signal 102 are deemed convenient by the system designer. For example, global reference tone 102 can be distributed through fiber-optic links, or AC power lines.

Figure 8:
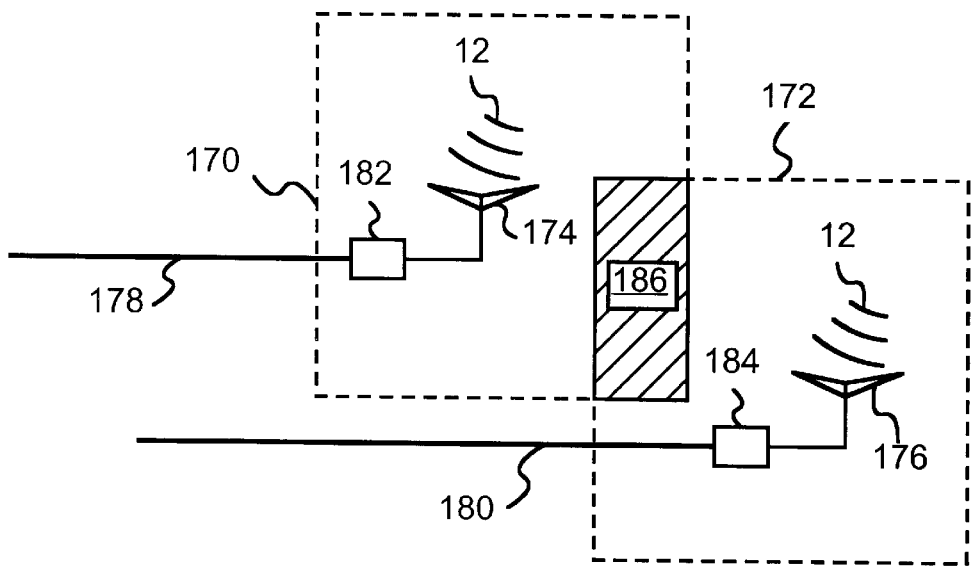
FIG. 8 is a schematic view illustrating the overlap in coverage areas.

FIG. 8 shows a particularly advantageous aspect of the invention. Two remote coverage sites 170 and 172 have corresponding RF antennas 174 and 176 for re-transmitting RF signal 12. As in the above embodiments, IF signal 94 is fed through a low bandwidth medium, in this case power cables 178 and 180. Units 182 and 184 contain all the elements discussed above necessary for recovering RF signal 12 from IF signal 94 according to the invention.

The RF coverage areas of sites 170 and 172 overlap. The region where this happens is hatched and designated by reference numeral 186. In general, overlap in coverage of adjacent sites is desirable because it guarantees complete coverage. A user equipped with an RF receiver (not shown) and positioned in region 186 will receive RF signal 12 from both antennas 174 and 176.

In prior art systems the instability of local oscillators, even of high-quality devices, incurs a small frequency difference, Δf, between RF signal 12 coming from antenna 174 and the same RF signal 12 arriving from antenna 176. This frequency difference, (typically about ±500 Hz), creates an audible beat frequency. Besides being annoying to the user, e.g., by interfering with the conversation in the case of telephonic communications, the beat frequency can impair the functioning of the electrical components and introduce spurious signals. RF distribution systems used for data transfer can experience higher bit error rates (BER) and other degrading effects.

Fortunately, RF distribution systems according to the invention can recover RF signal 12 with no frequency shift at all. Thus, in the present case, RF signal 12 radiated from antenna 174 and from antenna 176 will have the same frequency and not induce any beats.

Figure 9:
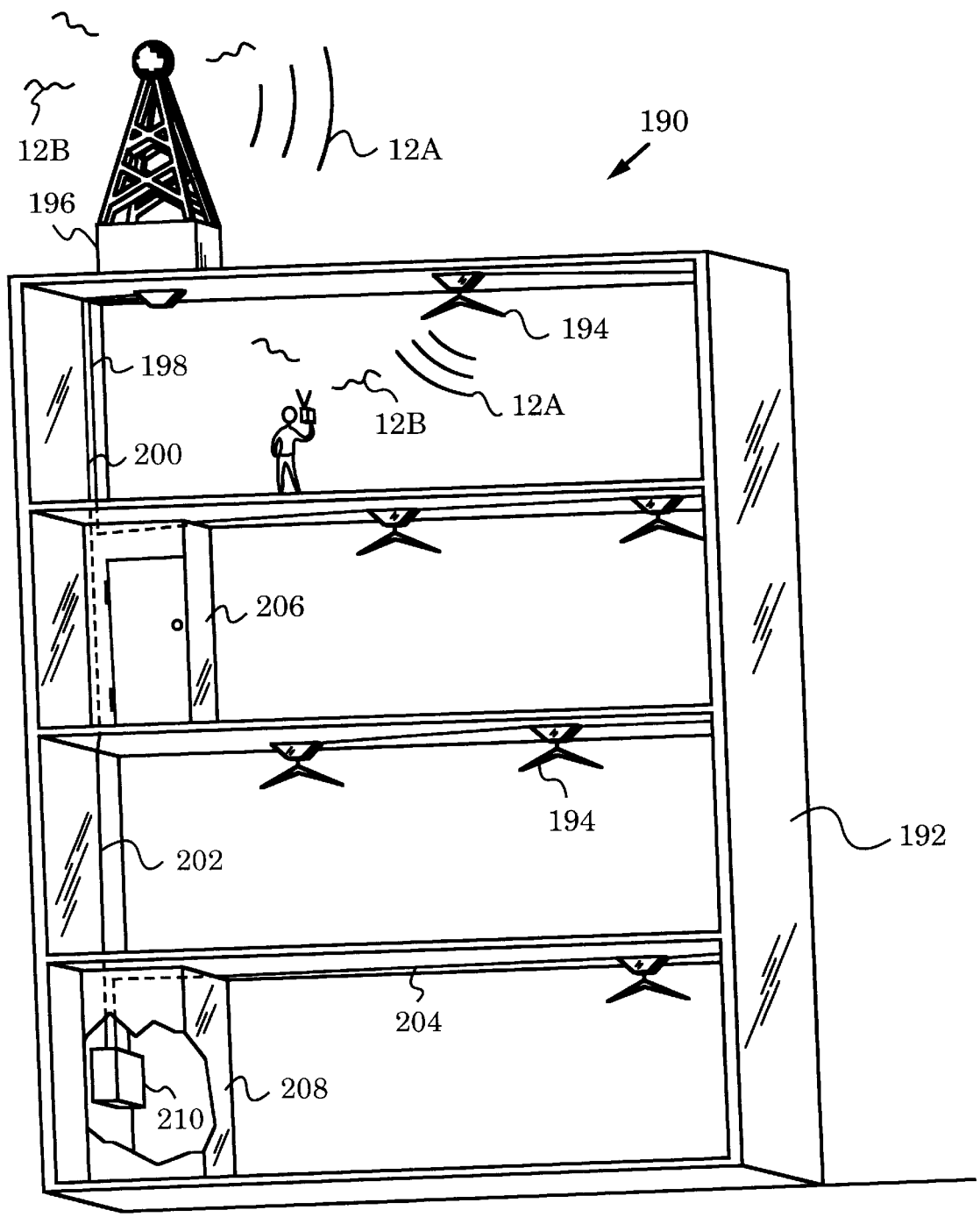
FIG. 9 is a three-dimensional view of the RF distribution system according to the invention adapted to a building structure.

FIG. 9 illustrates an RF distribution system 190 according to the invention used in a building structure 192. In this case system 190 is bi-directional, i.e., RF antennas 194 installed in various locations throughout structure 192 can re-transmit and receive RF signals 12. For better understanding, transmitted RF signals are designated by 12A and received RF signals are indicated by 12B. A main antenna 196 mounted on the roof of structure 192 can also transmit and receive RF signals 12A and 12B.

System 190 utilizes in-building low bandwidth network including cables 198, 200, 202, 204, and wiring closets 206 and 208 to distribute RF signal 12. In this particular arrangement, wiring closet 208 houses a distribution hub 210. The latter supplies global reference tone 102 from a temperature-stabilized crystal oscillator serving as the global reference oscillator (not shown). Protection of hub 210 from external influences is ensured by virtue of location of closet 208 on the ground floor and away from openings such as doors or windows.

It should be noted that cables 198, 200, 202, 204 may constitute a pre-existing network which can not be extensively modified by the designer without expensive re-routing work. For example, cables 198, 200, 202, 204 are standard AC power cables which are truly ubiquitous even in old structures. The choice of AC power cables will allow one to distribute RF signals in virtually any environment without altering the in-building cabling, thus providing an ultra-low-cost RF distribution network. An additional advantage of using AC power lines is that the power for operating antennas 194 and any other necessary electronics (not shown) can be provided through cables 198, 200, 202, and 204 simultaneously with the IF signal. Of course, since AC power lines are pre-installed, the designer of the RF distribution system will encounter some limitations. Indeed, in some rooms the locations of antennas 194 may be imposed by the infrastructure.

Figure 10:
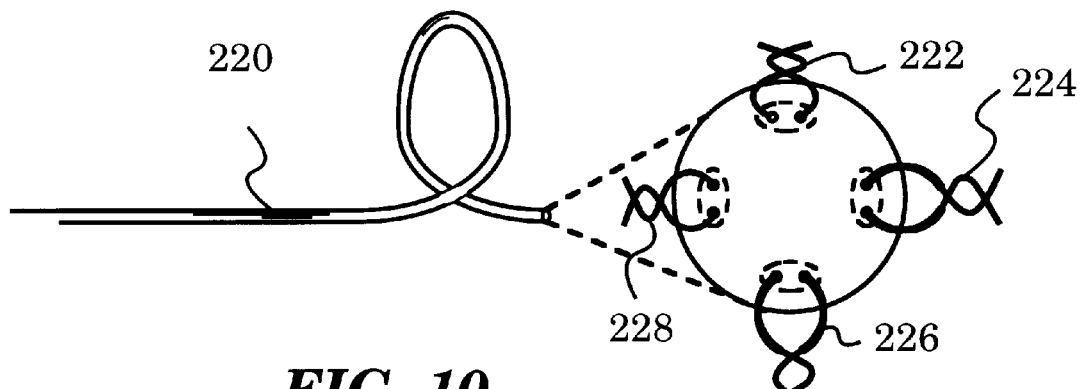
FIG. 10 is a diagram showing typical 10 Base T in-building cables.

FIG. 10 illustrates the most common low bandwidth medium 220 found inside buildings. In particular, medium 220 is a cable consisting of four twisted pairs 222, 224, 226, 228 or wire pairs. These can all be used for distributing signals for cellular communications, cordless telephony, local RF communications, satellite television, interactive multi-media video, or high bit-rate local area networks.

Figure 11:
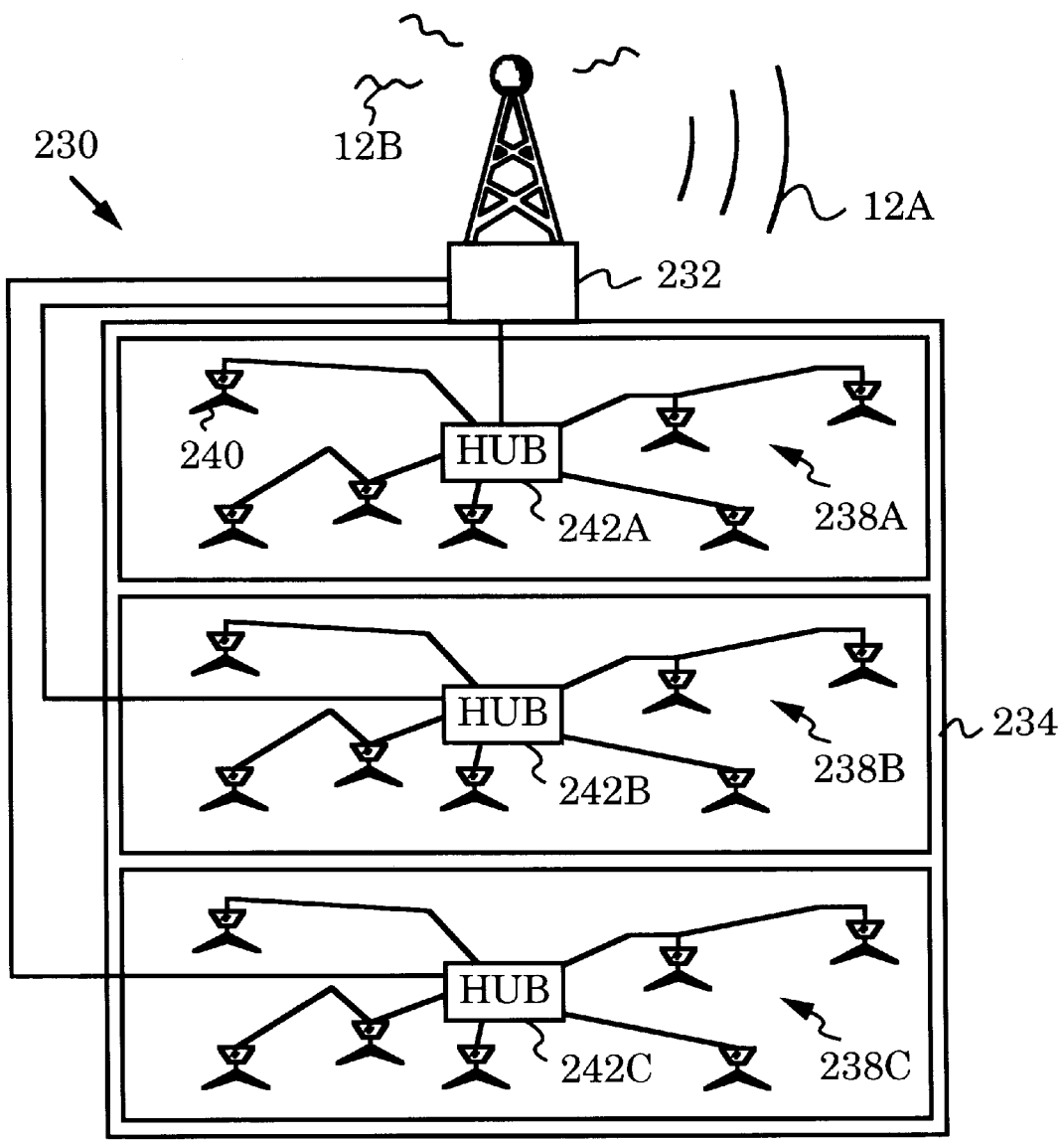
FIG. 11 is a schematic diagram of another RF distribution system according to the invention.

FIG. 11 illustrates schematically yet another RF distribution system 230 according to the invention. Main antenna 232 is positioned on top of a building 234 to receive and transmit RF signals 12A and 12B. System 230 consists of three star networks 238A, 238B, 238C, one per floor, individually fed from antenna 232. Networks 238A, 238B, 238C have RF antennas 240 and independent hubs 242A, 242B, 242C for housing the essential components discussed above.

Figure 12:
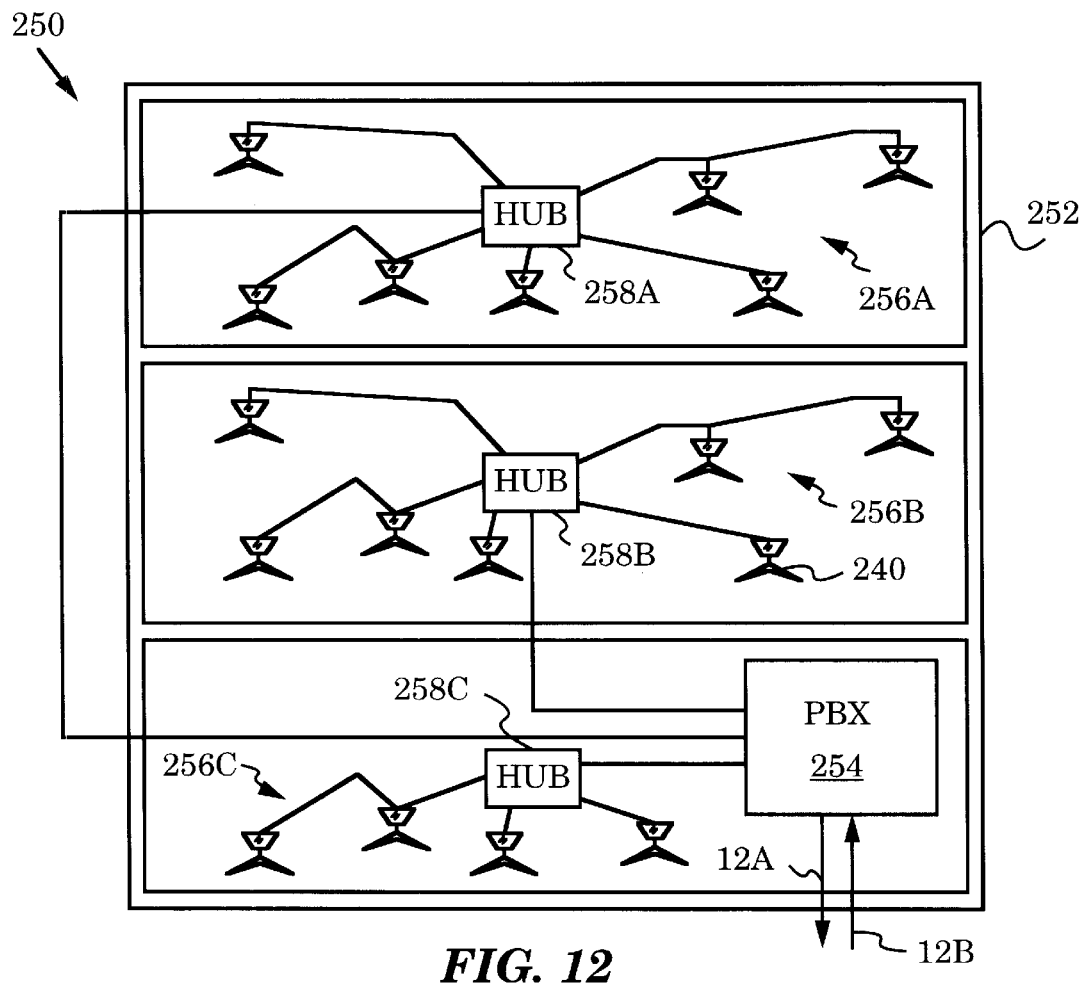
FIG. 12 is a schematic diagram of still another RF distribution system according to the invention.

FIG. 12 illustrates another advantageous RF distribution system 250 inside same building 252. System 250 takes advantage of a pre-installed private branch exchange 254 (PBX) and does away with a main antenna as the unit for receiving and re-transmitting RF signals 12A and 12B.

In this embodiment RF signals 12A and 12B are delivered to PBX 254 and received from it by any suitable high bandwidth medium (not shown). Thus, RF signals 12B are fed by PBX 254 to hubs 258A, 258B, 258C of three star networks 256A, 256B, 256C. Then, RF signals 12A are received from star networks 256A, 256B, 256C and sent back to PBX 254, which re-transmits them via the high bandwidth medium.

Since PBX systems are widespread, this embodiment is very practical. No additional cables need to be routed from any external RF antennas in this case. In fact, PBX systems are found in many locations and are frequently pre-wired for indoor within one or more building structures, and, in some cases, outdoor operation as well. Few modifications will be required to install an RF distribution system according to the invention in this manner.

Figure 13:
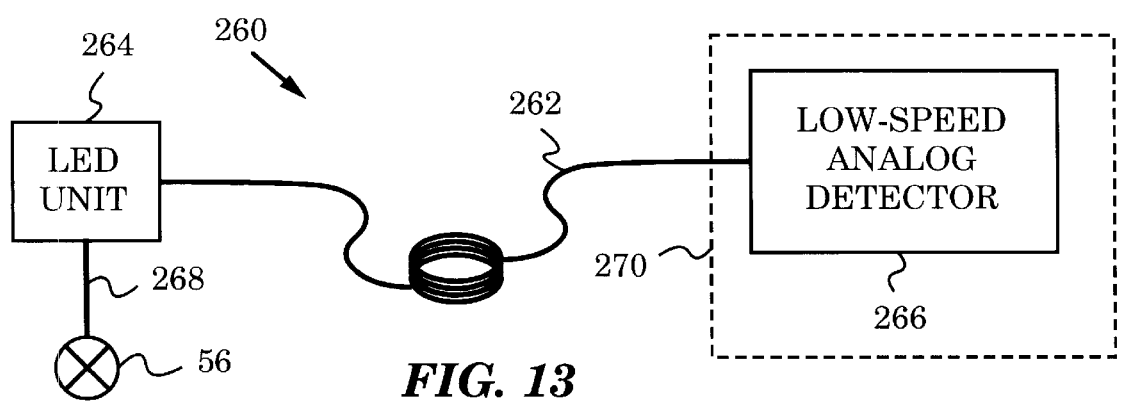
FIG. 13 is a diagram illustrating a portion of a system of the invention using multi-mode optical fiber.

FIG. 13 illustrates a portion of yet another system 260 according to the invention. A low bandwidth medium 262, in this case a multi-mode fiber optic cable, connects a LED (Light Emitting Diode) unit 264 to a low-speed analog detector 266 at a remote site 270. Because the transmission bandwidth of optic cable 262 required for this invention is below 100 MHz the length of cable 262 can exceed 1 km. The ability to cover such distances renders the embodiment particularly useful in shopping centers and other structures covering large areas.

Figure 4:
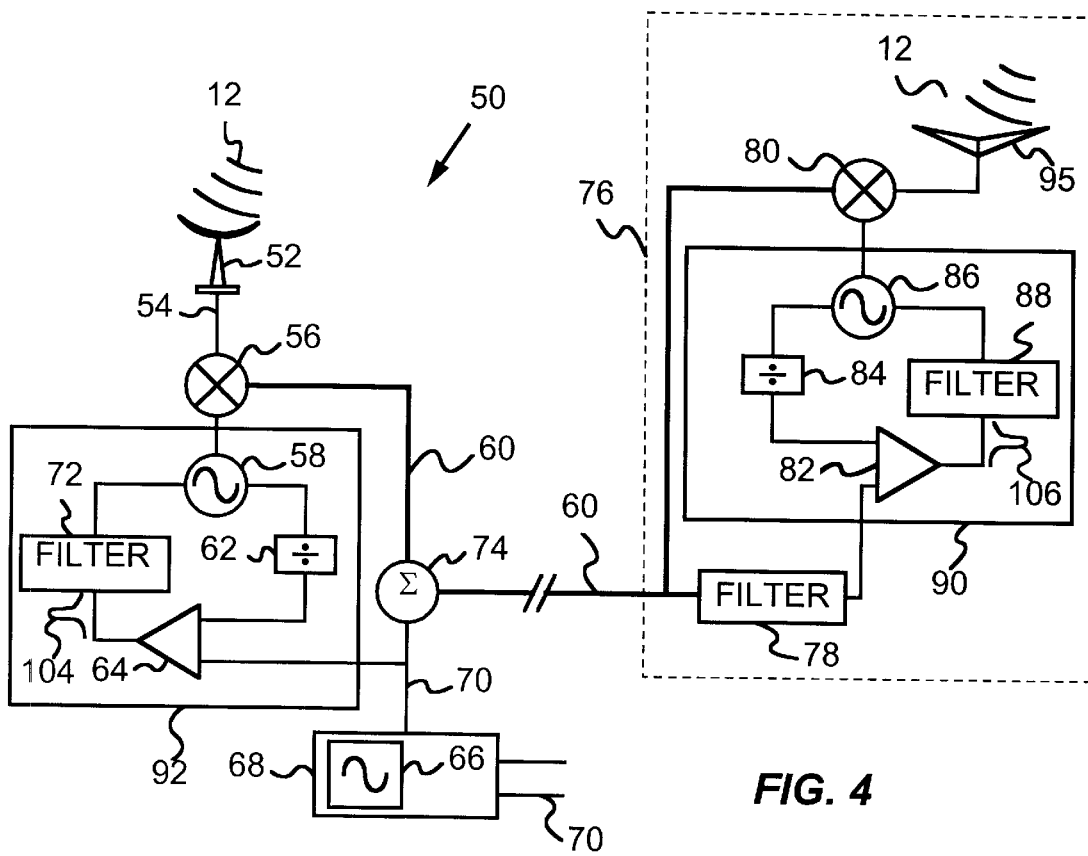
FIG. 4 is a schematic view of a simple RF distribution system according to the invention.

Same mixer 56 as in FIG. 4 delivers IF signal 94 to LED unit 264 via low bandwidth medium 268. Medium 268 may belong to a pre-installed network, e.g., AC power mains or telephone wires.

Figure 14:
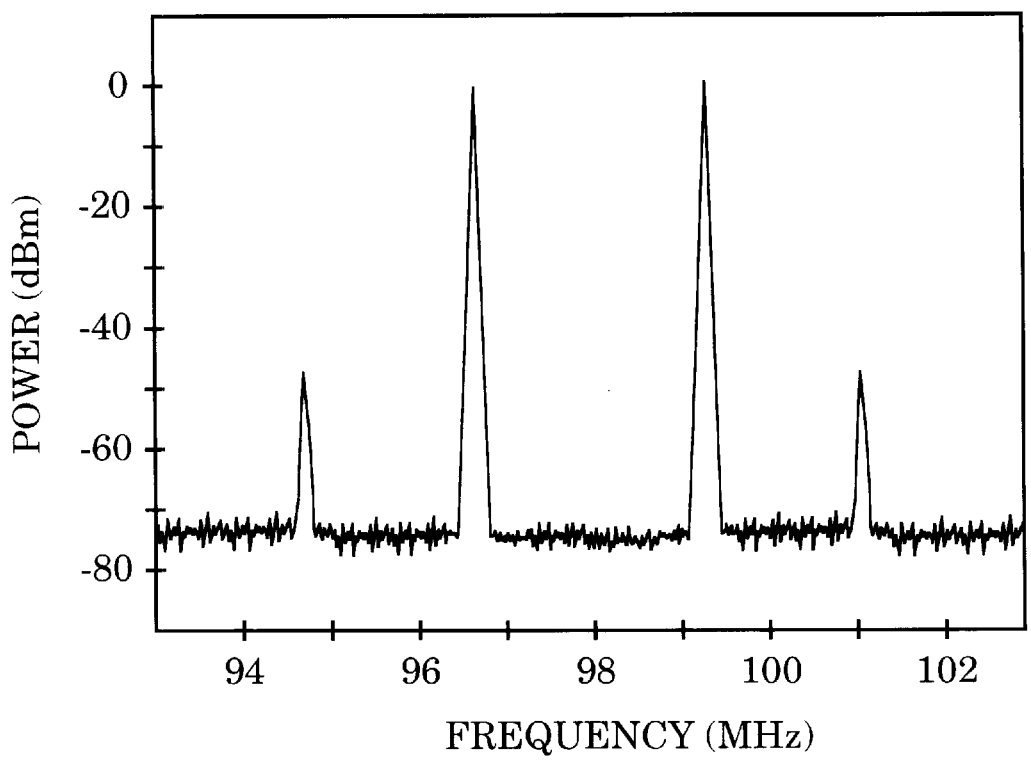
FIG. 14 is a graph of the Two Tone Test for the system of FIG. 13.

Low-cost LEDs exhibit an excellent response at low frequencies, in particular within the transmission bandwidth of medium 262, (<100 MHz), and no response at higher frequencies, e.g., 1 GHZ. Thus, LED unit 264 is well-suited for feeding IF signal 94 through medium 262. Conventional optical systems use lasers and single-mode optical fibers, both of which are expensive, to send signals at various frequencies. This embodiment is very low cost in comparison with conventional systems and very efficient in the desired frequency range. In support of this fact, FIG. 14 shows the results of a standard Two Tone Test for LED unit 264 operating at 1.3 um and 1 km long cable 262.

Figure 15:
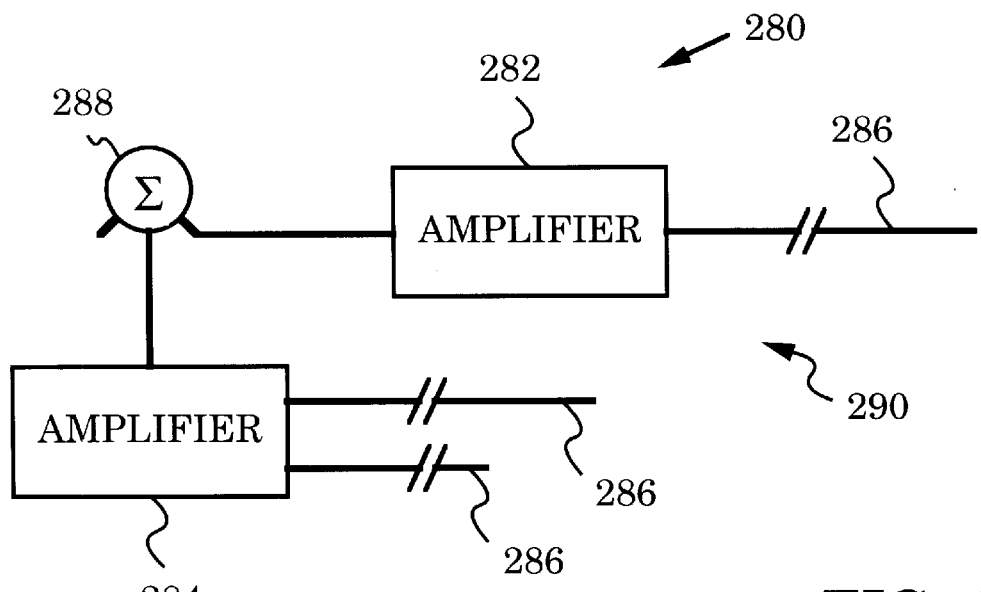
FIG. 15 is a diagram of an advantageous IF signal amplification method according to the invention.

FIG. 15 shows an advantageous addition to a portion of a system 280 according to the invention. System 280 uses a summing element 288 for adding global reference tone 102 to IF signal 94, as discussed above, and feeding both through a network 290 consisting of low bandwidth cables 286. Two standard amplifiers 282 and 284 for amplifying signals within transmission bandwidth 34 are connected to cables 286.

During operation amplifiers 282 and 284 amplify IF signal 94 while it passes through cables 286. If desired, both or one of amplifiers 282, 284 can also amplify global reference tone 102. A person skilled in the art will appreciate the fact that amplifying signals at lower frequencies is simpler and less costly than amplifying RF frequency signals. Thus, the present embodiment points out a particularly advantageous method for preserving the strength of signals distributed by a system according to the invention. This "repeater function" can be incorporated in any of the above embodiments by installing suitable low frequency amplifiers (<100 MHz) at frequencies corresponding to the IF signals and/or to the global reference tone.

As noted earlier in discussion of FIG. 10 a low bandwidth infrastructure of particular prevalence in office buildings is unshielded twisted pair (UTP) cable 220. UTP cable 220 contains 4 twisted pair cables 222, 224, 226, 228, as does the unshielded Category 5 twisted-pair 10 Base T cable typically employed for Ethernet data transmission. Using the method detailed herein an in-building radio distribution system can be connected with virtually no cost using pre-installed UTP cable when available, or at a low cost using new UTP cable since the infrastructure is standard in the industry. The remaining description details the use of UTP cable in RF distribution systems.

Figure 16A:
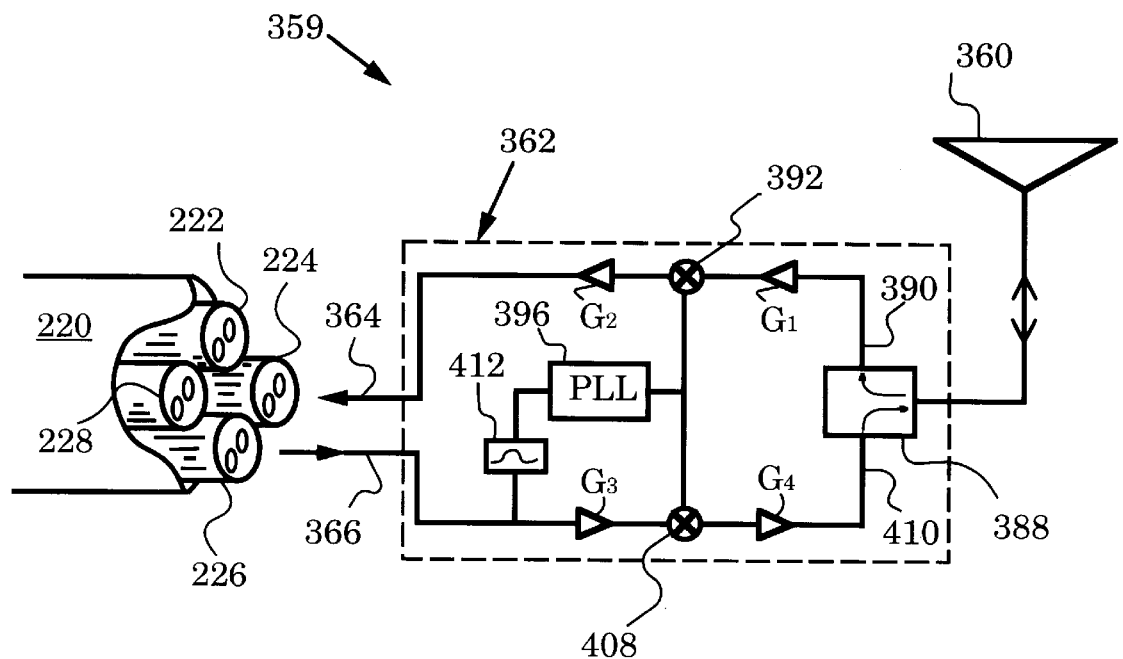
FIG. 16A is a diagram of a communication station for bi-directional communication over an UTP cable.

FIG. 16A depicts a schematic for a remote site antenna unit 359 for frequency duplex operation suitable for bi-directional communication over a UTP cable. FIG. 16A shows an antenna 360 of unit 359 attached to a corresponding antenna component block 362. The component block 362 in turn has a down-conversion connection 364 for feeding signals received by remote site antenna 360 into twisted pair 224 contained in UTP cable 220. Similarly, component block 362 has an up-conversion connection 366 for accepting signals from twisted pair 226 which will ultimately be re-transmitted by remote site antenna 360. It is contemplated that unit 359 has a receiving and re-transmission means other than an antenna 360, e.g., block 362 feeds directly into an electronic device such as a speaker phone or computer. With this in mind remote site antenna unit 359 is more broadly referred to as a communication station.

Figure 16B:
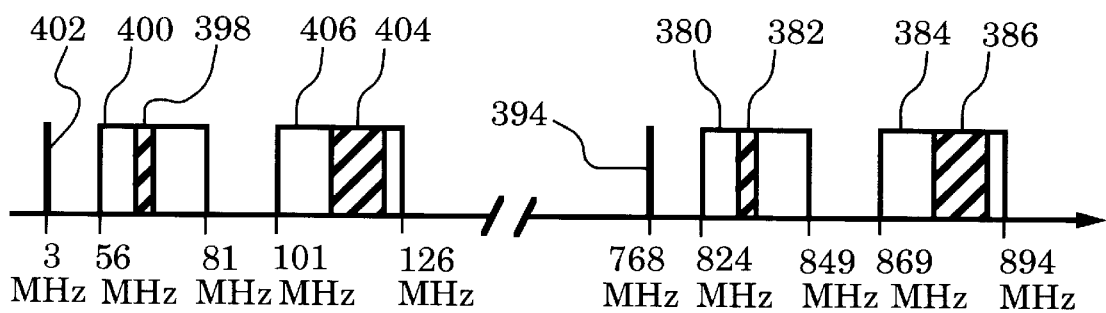
FIG. 16B is a diagram showing typical down- and up-conversion bandwidth channels for RF and IF signals.

FIG. 16B illustrates two separate frequency channels reserved, respectively, for signals to be received and signals to be transmitted by antenna 360. Specifically, a RF down-conversion channel 380 contains a RF down-conversion signal 382, while a RF up-conversion channel 384 contains a RF up-conversion signal 386. The bandwidth of RF down-conversion channel 380 is 824 MHz–849 MHz or 25 Mhz; similarly, the bandwidth of RF up-conversion channel 384 is 869 MHz–894 MHz, or also 25 MHz. Again these numbers are for illustrative purposes and other embodiments can obviously operate with channels of different bandwidths.

The operation of antenna component block 362 in passing RF down-conversion signal 382 from antenna 360 to twisted pair 224 is as follows. RF down-conversion signal 382 is received by antenna 360 and fed to a frequency duplexer 388 within block 362. Duplexer 388 routes all signals in down-conversion channel 380 including RF down-conversion signal 382 through an upper connection 390. The RF down-conversion signal 382 is then amplified by amplifier $G_1$ and sent to a first mixer 392. Mixer 392 combines RF down-conversion signal 382 with a highly stable RF reference tone 394 received from a phase-locked loop 396 and down-converts the RF down-conversion signal 382 to a lower frequency IF down-conversion signal 398. The resulting IF down-conversion signal 398 is contained in an IF down-conversion channel 400 of sufficiently low bandwidth as to be suitable for transmission over a low bandwidth medium such as a twisted pair cable. In the present embodiment, following amplification by amplifier $G_2$, the IF down-conversion signal 398 exits antenna component block 362 through down-conversion connection 364 and enters into twisted pair 224 for further transmission.

Details of phase-locked loop 396 are as described in earlier embodiments. Phase-locked loop 396 takes as input a global oscillator tone 402 and outputs a highly stable RF reference tone 394. Global oscillator tone 402 can be delivered in any number of ways to phase-locked loop 396. A preferred approach is to send the global oscillator tone 402 over the same twisted pair 226 which carries signals to be transmitted by antenna 360. This configuration is illustrated in FIG. 16A. Both global oscillator tone 402 and an IF up-conversion signal 404 are fed from twisted pair 226 into antenna component block 362 through up-conversion connection 366. A filter 412 then removes the global oscillator tone from connection 366 and feeds the tone to phase-locked loop 396. Loop 396 in turn outputs highly stable RF tone 394 for up-conversion at first mixer 392 and for down-conversion at a second mixer 408.

Up-conversion of signals sent over twisted pair 226 is accomplished in antenna unit 359 as follows. IF up-conversion signal 404 contained in an IF up-conversion bandwidth 406 is fed from twisted pair 226 into up-conversion connection 366, amplified by amplifier $G_3$, and mixed with RF reference tone 394 in second mixer 408. The output of second mixer 408, an RF up-conversion signal 386, is amplified by amplifier $G_4$ and fed through a lower connection 410 to duplexer 388. Here, duplexer 388 feeds RF up-conversion signal 386, and any other signals contained in RF up-conversion channel 384, to antenna 360 for transmission.

There are several other embodiments or variations producing bi-directional communication according to the present invention besides that shown in FIG. 16A. Obviously, one could set up, side-by-side, two copies of a uni-directional system, each as taught in the earlier part of this description, but with their directions of communication reversed. Thus a remote coverage site would have two antennas, one for reception and one for transmission, and each antenna would have its own phase-locked-loop; further each uni-directional system would have its own global oscillator. FIG. 16A teaches that many of the components can be efficiently shared between the up- and down-conversion portions.

Figure 17:
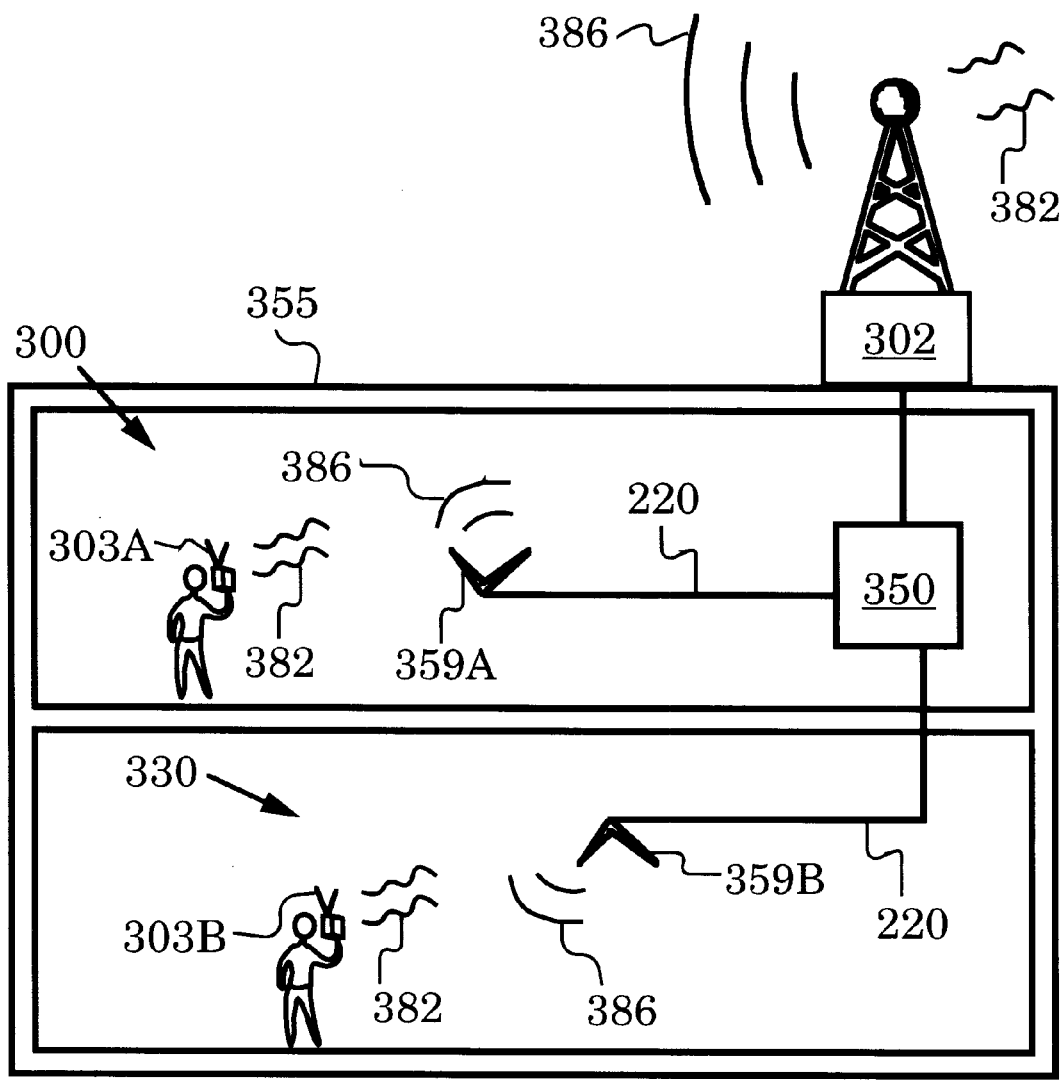
FIG. 17 is a diagram of a connection between a 10 base T cable and remote site antenna with voltage controlled gain according to the invention.
Figure 18:
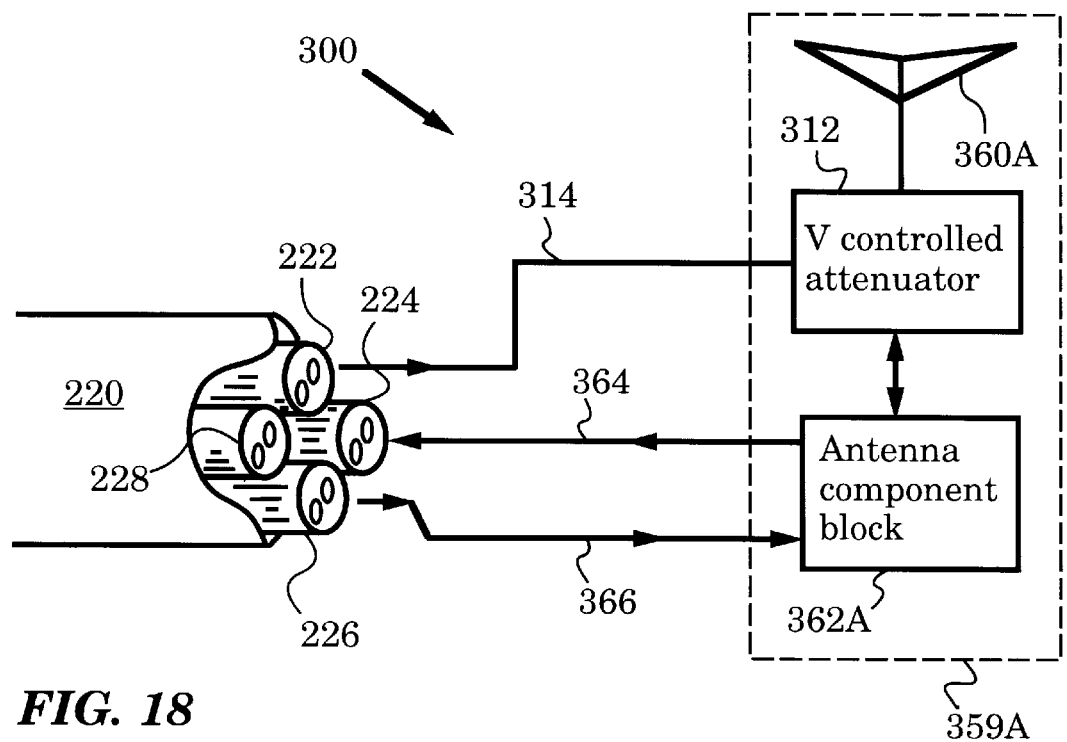
FIGS. 18 and 19 are diagrams of a connection between a 10 base T cable and remote site antenna with testing means according to the invention.
Figure 19:
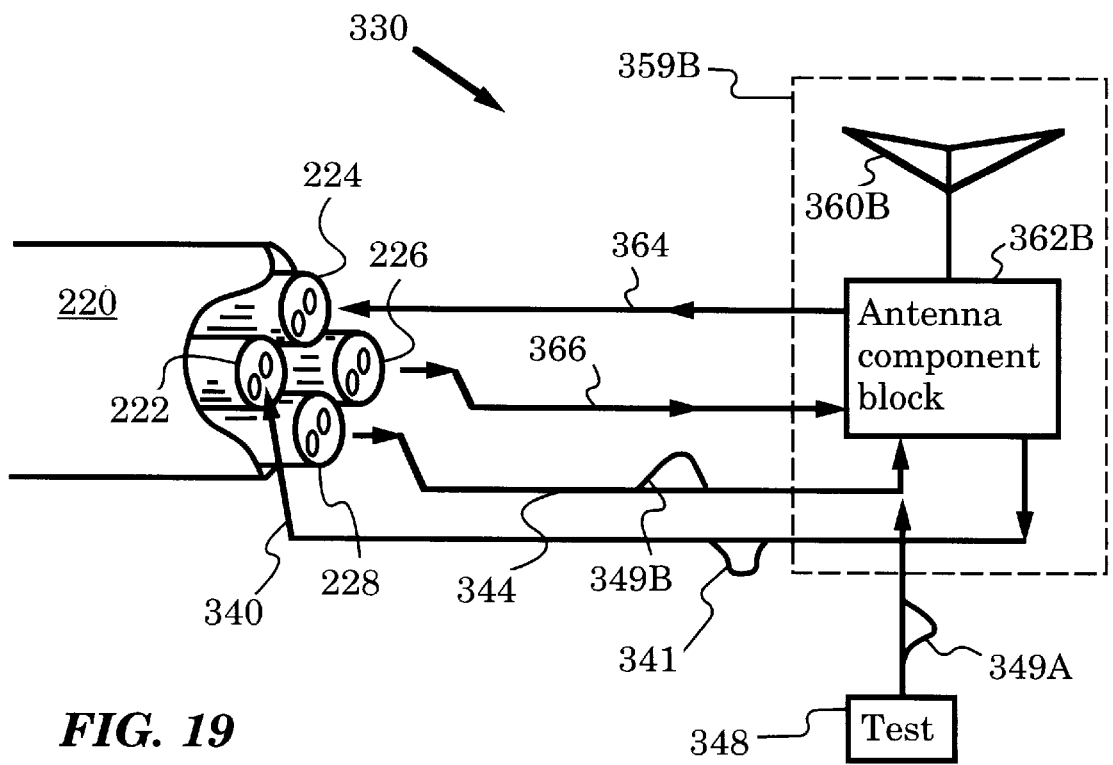

FIG. 17, FIG. 18 and FIG. 19 illustrate some especially advantageous features that can be incorporated in a distribution system over UTP cable 220. FIG. 17 depicts a RF distribution system for a building structure 355 using a network of UTP cable 220 to distribute RF signals 386 received from a main antenna 302. RF signals 386 are re-transmitted from remote site antenna units 359A and 359B into remote coverage sites 300 and 330, respectively. In addition the system is bi-directional; RF signals 382 received by remote site antenna units 359A and 359B from user transmission units 303A, 303B are directed back to main antenna 302 and re-transmitted.

FIG. 18 and FIG. 19 show the connections between antenna units 359A and 359B and UTP cable 220. Typical radio distribution for bi-directional communication requires the use of 2 of the 4 twisted pair cables 222, 224, 226, 228 of UTP cable 220; one pair 226 for (up-conversion or downlink) transmission of signals into remote sites 300, 330, and one pair 224 for (down-conversion or uplink) transmission out. As will now be demonstrated, the remaining two twisted pair cables 222, 228 can be used to provide control and/or monitoring of remote site antenna units 359A, 359B from a centralized location 350 within building structure 355. In this way monitoring and adjusting of remote site antenna units 359A, 359B can be performed quickly and efficiently.

A centralized location, such as location 350, is a building location (or other location within a structure through which RF distribution is desired) where cable connections from remote coverage sites come together. This location is highly dependent on the nature of a given building structure and the nature of pre-existing cable. One skilled in the art can readily determine a suitable location on a case-by-case basis, supplying and installing additional cable when and where necessary. Although main building structures could best be served by a plurality of centralized locations each controlling subsets of coverage site antennae, a proposition whose details are obvious in light of the present description, for concreteness we focus on the building structure 355 of FIG. 17 with centralized location 350 for the remainder of this detailed description.

FIG. 18 depicts a remote coverage site 300 of structure 355 of FIG. 17 serviced by UTP cable 220. Within coverage site 300, twisted pair 226 of cable 220 transmits IF up-conversion signal 404 through up-conversion connection 366 and into an antenna component block 362A for conversion to RF signal 386 and subsequent re-transmission by antenna 360A. Another twisted pair 224 is connected to down-conversion connection 364. RF down-conversion signal 382 received by antenna 360A is converted to IF down-conversion signal 398 within antenna component block 362A and passed through down-conversion connection 364 to twisted pair 224 within cable 220.

Antenna component block 362A contains all the circuitry of antenna component block 362 of FIG. 16. In particular the gain of block 362A is provided by amplifiers $G_1$, $G_2$, $G_3$, $G_4$ which preferably increase (although could be arranged to decrease) the strength of signals received from up-conversion connection 366 prior to transmission into coverage site 300 and similarly increases (decreases) the strength of signals received from coverage site 300 prior to transmission through down-conversion connection 364. Antenna unit 359A further comprises a voltage controlled attenuator 312 which adjusts the level of signal transmission gain. Preferably, the attenuator 312 is situated between antenna component block 362A and antenna 360A. The level of attenuation provided by attenuator 312 is controlled by a voltage V on a connection 314 to twisted cable 222. Voltage V in turn can readily be controlled at centralized location 350 by means obvious to one skilled in the art. In this manner for each remote coverage site 300 (only one site is shown in FIG. 17) the individual antenna gain, or equivalently, the extent of site coverage, is controlled from centralized location 350 in the building 355. Thus the entire radio frequency distribution system can be conveniently adjusted and optimized from centralized location 350.

Alternatively, rather than controlling both up- and down-conversion gains with a single attenuator and a single twisted pair, finer control can be attained by using two twisted pairs, one pair to control up-conversion gain and one pair to control down-conversion gain. In this variation a voltage controlled attenuator is placed on down-conversion connection 364 and one is place on up-conversion connection 366 (not shown). The voltage on twisted pair 228 is used to control the attenuator on connection 366, while the voltage on twisted pair 222 controls the attenuator on connection 364. In this way the up- and down-conversion gains can individually be adjusted from a centralized location.

Although antenna gain is a highly desirable characteristic to adjust from centralized location 350, once given the above description a skilled artisan can readily conceive of many other features at a remote site 300 which can be similarly controlled or adjusted in a useful manner. Furthermore, if the embodiment of FIG. 18 is employed to adjust antenna gain, then the remaining twisted pair 228 of FIG. 18 can also be used to adjust or control any one of these features. These features are not necessarily limited to properties of antenna unit 359A. A twisted pair 228 could be used as a switch for any device in the remote site 300. Alternatively, remaining twisted pair cables can carry other communication services. Examples include data LAN (local area network), video, wired voice, and other wireless services such as PCS (personal communications systems) and wireless LANs.

Not only is it desirable to adjust features of a remote coverage site from centralized location 350, it is also desirable to monitor various aspects of the remote site so that one can determine if these aspects or features need to be adjusted. For example, in order to determine if an antenna unit 359B in a remote coverage site 330, shown in FIG. 19, is operable the following procedure is performed. A test signal 349A created by a test means 348 is directed to antenna component block 362B. Antenna component block 362B when operable responds to the test by sending a predetermined affirmative signal 341 back to centralized location 350 via connection 340 to twisted pair 222.

Test means 348 can be in the form of an electronic device constructed by techniques known in the art and installed at remote coverage site 330 either permanently, or perhaps temporarily for the purpose of system set-up diagnostics and testing. Alternatively, a test signal 349B is initiated at centralized location 350 and travels over another twisted pair cable 228 through connection 344 to antenna unit 359B. In this way, a human or computerized monitor can test the operability of each remote site antenna from a centralized location 350. A very simple embodiment of this testing scheme is to have the voltage on twisted pair 222 continually indicate whether antenna component block 362B is drawing power; a higher voltage on twisted pair 222 indicating the affirmative, lower or zero voltage, the negative. In this case, twisted pair 228 is not needed for testing and could be used for other purposes such as adjusting antenna gain.

Clearly there are many useful variations on this theme. For example, the test means could be a generator producing a RF test signal which antenna 360B receives and transmits to the centralized location 350 through the down-conversion connection 364 and twisted pair cable 224, or alternatively through connection 340 and twisted pair cable 222. The strength of the test signal arriving at the centralized location is then indicative of the antenna gain. The gain then can be adjusted appropriately if needed, preferably, by adjusting the voltage on a remaining twisted pair cable which in turn controls the gain of the antenna as described above.

The versatility of RF distribution systems according to the invention and its numerous embodiments teach a method of distributing RF signals. Indeed, a person skilled in the art will be able to glean from the examples given the characteristic features of the method of the invention.

SUMMARY, RAMIFICATIONS, AND SCOPE

The presented embodiments are only illustrative of some of the many types of networks of UTP cable which can be used according to the invention to distribute RF signals while simultaneously supporting antenna functionality and/or alternate communication services. Every particular network will be different, as conditioned by pre-existing infrastructure. Adaptations to particular bandwidths and frequencies, (e.g., for IF signals) will be made depending on application.

Therefore, the scope of the invention should be determined, not by examples given, but by the appended claims and their legal equivalents.

We claim:

1. A method for transmitting a RF signal contained in a RF bandwidth over a low bandwidth medium having a transmission bandwidth below said RF bandwidth, said low bandwidth medium comprising a main cable, said main cable comprising a plurality of constituent cables, said method comprising the steps of:

a) receiving said RF signal;

b) providing a global reference tone of high stability at a frequency within said transmission bandwidth of said low bandwidth medium;

c) generating a first RF reference tone of high stability by using a first adjustment signal derived from said global reference tone to control the output of a first local oscillator, such that said first local oscillator generates said first RF reference tone;

d) mixing said first RF reference tone with said RF signal to produce an IF signal within said transmission bandwidth;

e) feeding said IF signal through a first constituent cable of said plurality of constituent cables;

f) generating a second RF reference tone of high stability by using a second adjustment signal derived from said global reference tone to control the output of a second local oscillator, such that said second local oscillator generates said second RF reference tone; and g) mixing said second RF reference tone with said IF signal fed through said first constituent cable to recover said RF signal; and h) re-transmitting said RF signal recovered from mixing said second RF reference tone with said IF signal.

2. The method of claim 1 wherein said RF signal is received at a remote coverage site in step (a) and re-transmitted at a base station in step (h).

3. The method of claim 1 wherein said RF signal is received at a base station in step (a) and re-transmitted by an antenna at a remote coverage site in step (h).

4. The method of claim 3 wherein the voltage on a second constituent cable contained in said plurality of constituent cables controls the strength of said RF signal re-transmitted by said antenna.

5. The method of claim 4 wherein the voltage on said second constituent cable is adjusted at a centralized location.

6. The method of claim 1 wherein said main cable is cable selected from the group of cable consisting of 10 base T cable, telephone wire cable, and unshielded cable.

7. The method of claim 1 wherein said plurality of constituent cables comprises twisted pair cables.

8. The method of claim 1 wherein a second constituent cable supports a communication service selected from the group of communication services consisting of data local area network, video, wired voice, wireless personal communications system, and wireless local area network.

9. The method of claim 1 wherein said RF bandwidth is selected from the group of RF bandwidths used for cellular communications, cordless telephony, local RF communications, satellite television, interactive multimedia video, and high-bit rate local area networks.

10. In a system for bi-directional communication, a communication station for transmission of RF signals contained in a RF bandwidth over a low bandwidth medium having a transmission bandwidth below said RF bandwidth, said system comprising a global reference oscillator for providing said system with a global reference tone of high stability at a frequency within said transmission bandwidth of said low bandwidth medium, wherein said communication station comprises:

a) a receiving means for receiving a first RF signal;

b) a local oscillator controlled by an adjustment signal derived from said global reference tone, such that said local oscillator generates a RF reference tone of high stability;

c) a down-conversion means comprising a first mixing means connected to said receiving means and to said local oscillator for mixing said RF reference tone with said first RF signal to produce a first IF signal within said transmission bandwidth, said first mixing means being further connected to said low bandwidth medium for feeding said first IF signal through said low bandwidth medium;

d) an up-conversion means comprising a second mixing means connected to said local oscillator and to said low bandwidth medium for receiving a second IF signal, said second IF signal being produced with a second RF signal and a second down-conversion means at a distant location, said second mixing means further mixing said second IF signal with said RF reference tone to recover said second RF signal; and e) a transmitting means for transmitting recovered second RF signal.

11. The system of claim 10 wherein said low bandwidth medium is an element of the group of low bandwidth media consisting of 10 base T cable, telephone wire, unshielded twisted pair cable, power cable.

12. The system of claim 10 wherein said low bandwidth medium comprises main cable, said main cable comprises a plurality of constituent cables.

13. The system of claim 12 wherein said constituent cables comprise twisted pair cables.

14. The system of claim 12 wherein said down-conversion means feeds said first IF signal through a first constituent cable of said plurality of constituent cables and said up-conversion means receives said second IF signal through a second constituent cable of said plurality of constituent cables.

15. The system of claim 14 wherein said global reference tone is fed simultaneously with said second IF signal through said second constituent cable to said up-conversion means.

16. The system of claim 14 wherein a second up-conversion means at said distant location receives said first IF signal from said first constituent cable and recovers said RF signal from said IF signal.

17. The system of claim 12 wherein a subset of said constituent cables carry electrical signals from a centralized location to said communication station for controlling said transmitting means.

18. The system of claim 17 wherein said main cable is 10 base T cable and said plurality of constituent cables is four twisted pair cables.

19. The system of claim 12 wherein the voltage on a constituent cable of said subset of constituent cables controls the gain of said transmitting means.

20. The system of claim 12 wherein a subset of said constituent cables carry electrical signals from said communication station to a centralized location for monitoring said communication station from said centralized location.

21. The system of claim 20 wherein said main cable is 10 base T cable and said plurality of constituent cables is four twisted pair cables.

22. The system of claim 20 further comprising an operation test means for testing the operability of said communication station wherein the outcome of said test is carried over said subset of constituent cables to said centralized location.

23. The system of claim 22 wherein said test means is initiated at said centralized location by sending a signal over a second subset of said constituent cables to said communication station.

24. The system of claim 20 wherein the voltage on one constituent cable of said subset indicates that said communication station is drawing power.

25. The system of claim 12 wherein said global reference tone is fed to said communication station through one constituent cable of said plurality of constituent cables.

26. The system of claim 10 wherein said receiving means and said transmitting means of said communication station comprise a diplexer for frequency duplex communication.

27. The system of claim 26 wherein said communication station further comprises an antenna connected to said diplexer.

* * * * *